(12) United States Patent
Wang

(10) Patent No.: US 9,225,323 B1
(45) Date of Patent: Dec. 29, 2015

(54) SIGNAL CROSSING DETECTION

(71) Applicant: NXP B.V., Eindhoven (NL)

(72) Inventor: Ge Wang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/309,329

(22) Filed: Jun. 19, 2014

(51) Int. Cl.
*H05B 37/02* (2006.01)
*H03K 5/1536* (2006.01)
*H02M 3/158* (2006.01)
*H05B 33/08* (2006.01)

(52) U.S. Cl.
CPC ............. *H03K 5/1536* (2013.01); *H02M 3/158* (2013.01); *H05B 33/0815* (2013.01)

(58) Field of Classification Search
USPC ............... 315/209 R, 291, 299, 308; 323/235
See application file for complete search history.

(56) References Cited

U.S. PATENT DOCUMENTS

| | | | | |
|---|---|---|---|---|
| 3,564,406 | A * | 2/1971 | Henderson et al. | 324/99 D |
| 3,757,230 | A * | 9/1973 | Keeney, Jr. | 327/129 |
| 7,800,928 | B1 * | 9/2010 | Dernovsek et al. | 363/132 |
| 2012/0218792 | A1 * | 8/2012 | Ziegler et al. | 363/84 |

OTHER PUBLICATIONS

Vratislav, M., "Inductor Current Zero-Crossing Detector and CCM/DCM Boundary Detector for Integrated High-Current Swithched-Mode DC-DC Converters". DOI 10.11091TPEL.2013.2292600, IEEE Transactions on Power Electronics.

* cited by examiner

*Primary Examiner* — Thuy Vinh Tran

(57) ABSTRACT

Various aspects of the present disclosure are directed to detecting crossings such as zero crossings that can pose problems to circuit operation. In accordance with an example embodiment, two or more circuits are implemented for detecting signal crossings of an electrical signal during respective time cycles, such that at least one of the circuits is operating to detect such a crossing at all times. Each circuit undergoes a reset condition, which is controlled to ensure that at least one circuit remains operating for detecting zero crossing.

19 Claims, 4 Drawing Sheets

SIGNAL CROSSING DETECTION

Aspects of various embodiments are directed to detecting signal crossings, such as zero crossings.

Detecting crossing points, such as zero-crossing points, can be useful for a variety of applications, such as for circuit drivers that may be used with a multitude of products. Various approaches have been implemented for detecting such crossing points, with the result used for a variety of purposes. For instance, it can be useful to detect zero current conditions in order to shut down circuits that may be harmed under such operation, or to conserve energy.

In various ZCD (zero crossing detection, or zero current detection) circuits, an input offset voltage may exist (e.g., in the range of 10 mV at 6 sigma level/range of Gaussian distribution) with a comparator. Some high-accuracy comparators may exhibit residue input offset voltage (e.g., around ~3 mV over 6 sigma of Gaussian distribution), which may drift in accordance with process, voltage and temperature variations. Such a comparator may be relatively slow in operation. Further, low offsets, such as a 3 mV, still may not be tolerable for certain applications (e.g., several hundred mA may be passed by switches exhibiting a low on resistance).

These and other matters present challenges to highly-accurate and fast crossing detection, and the implementation thereof, for a variety of applications.

Various example embodiments are directed to ZCD circuits and their implementation.

According to an example embodiment, an apparatus includes first and second crossing detection circuits and a reset circuit. The crossing detection circuits detect a signal crossing of an electrical signal during respective first and second time cycles, with the signal crossing pertaining to a fixed value (e.g., zero) that the signal crosses. The reset circuit resets the first crossing detection circuit while the second time cycle is active, and resets the second crossing detection circuit while the first time cycle is active. Using such an approach, at least one of the circuits operates at all times, such that the circuits (in combination) provide a signal crossing detection output in response to the signal crossing the fixed value during any of the time cycles.

Another apparatus is directed to first and second means that detect such a signal crossing during respective time cycles, and that provide an output indicative of a signal crossing during any of the time cycles. Similar to the above, a reset operation is carried out such that the respective means do not reset concurrently (i.e., to maintain at least one of the means monitoring for a zero crossing at all times during operation). In certain implementations, switching means terminate operation of a circuit in response to detecting the signal crossing. For instance, where a switching means connects a load to a source, the load is decoupled in response to the signal crossing detection output being indicative of the signal crossing. In various implementations, capacitors are used to sample circuit values that are used to detect a zero crossing, and a comparator is connected to compare outputs of the capacitors to provide an output indicative of a crossing detection.

Other embodiments are directed to methods involving one or more embodiments discussed above. In some implementations, operation of one or more circuits is terminated when a signal crossing is detected. For instance, a load may be disconnected under such conditions. In certain embodiments, capacitive charge is discharged during reset conditions, as above.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
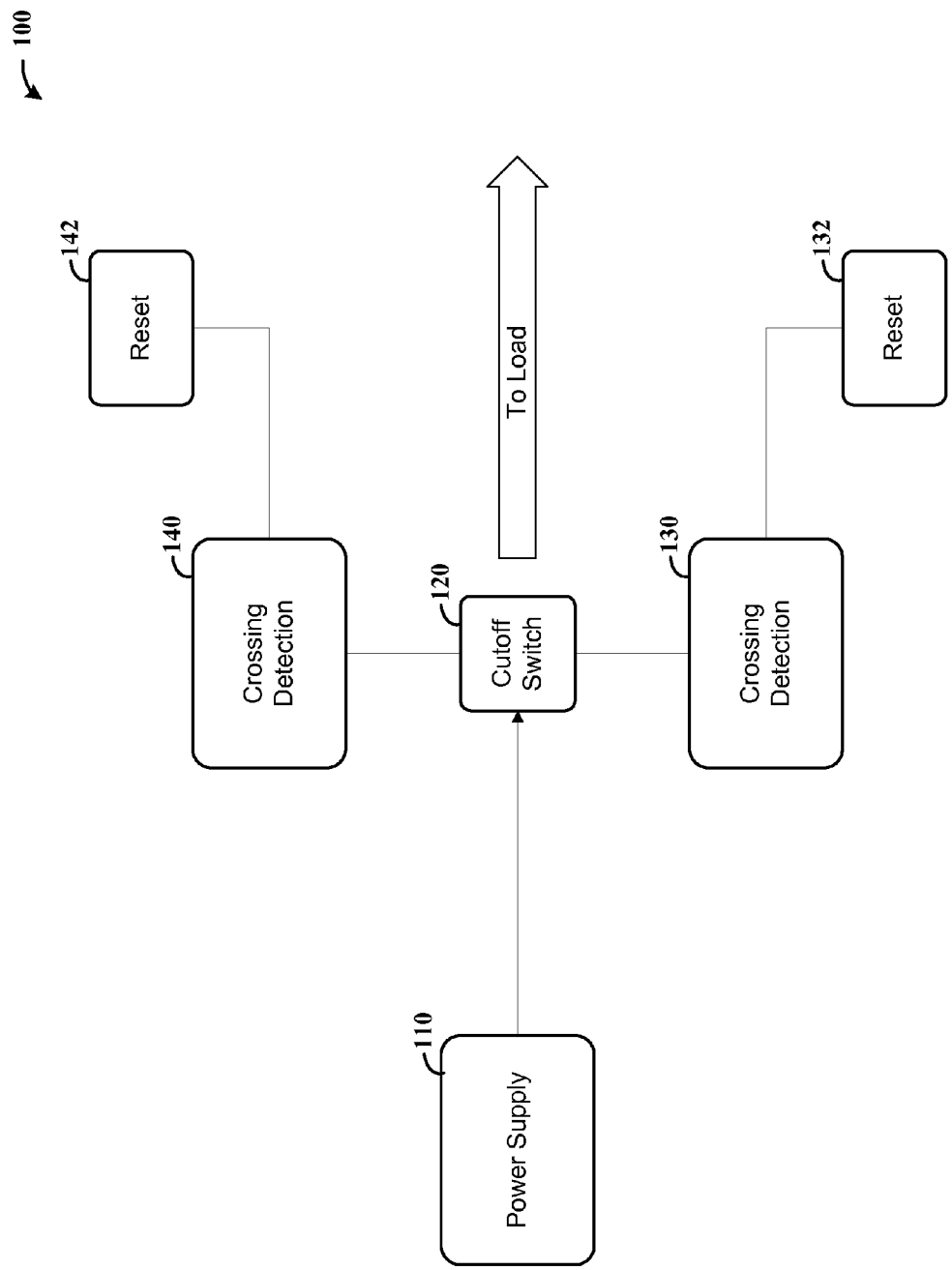
FIG. 1 shows a crossing detection circuit, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving zero crossing detection. While not necessarily so limited, various aspects may be appreciated through a discussion of examples using this context.

Various example embodiments are directed to an auto-zero, ZCD circuit and related methods, as may be implemented with an associated ZCD detection scheme for a variety of circuits. The ZCD circuit operates with two or more detection components, which respectively reset under conditions in which another detection component actively monitors for detecting zero crossings. In various embodiments, the ZCD circuit is used to address issues such as those discussed in the background above, which may be applicable to circuits such as a synchronized boost regulator.

In certain embodiments, the ZCD circuit operates to protect a high-side switch (e.g., a MOSFET switch) in an inductor-based circuit, such as a boost regulator (e.g., boost converter), which may be implemented in place of a power diode for a fully integrated design for efficiency. When current via the high-side switch is zero, the switch is turned off or otherwise disabled to protect the system. This may also save energy. Each of the detection components operates to carry out an auto-zero function, in accordance with a double-phase detection scheme, during which at least one of the components is active during operation of the switch. Accordingly, constant monitoring of zero-crossings and related protection are provided. Further, this approach can be used with pulse-width modulation (PWM) or non-PWM applications, such as those involving pulse frequency modulation (PFM).

In various implementations, each detection component operates to zero out capacitance in a manner that mitigates or prevents the detection component's ability to detect zero crossings. As such, the components operate relative to each other, to ensure that at least one of the components monitors for zero crossings and protects related circuitry at all times.

A more particular embodiment is directed to an apparatus having first and second crossing detection circuits that each detect signal crossings (e.g., zero current) of an electrical signal during respective first and second time cycles. A reset circuit resets each crossing detection circuit by controlling the reset to occur during a time period in which the other crossing detection circuit is monitoring for a crossing detection (e.g., by resetting a stored value). An output indicative of a signal crossing is provided and, for example, used to disconnect or otherwise disable a circuit that may be harmed under such conditions, or to save power.

In some implementations, a boost regulator circuit operates with the crossing detection circuits to terminate boost regulator operation in response to either of the first and second crossing detection circuits detecting the signal crossing. Other embodiments involve a light-emitting diode (LED) and an LED current controller that decouple current to the LED in response to the signal crossing detection output being indicative of the signal crossing.

In various embodiments, a switch is used to disconnect a load based on a zero-crossing detection. For instance, ZCD detection circuits as described herein, or related control circuits, may be operable to open such a switch when a zero crossing is detected. In some implementations, signal crossings are detected based upon a voltage value across the switch, and the switch is run in an open position in response to the signal crossing detection output being indicative of a signal crossing.

In a more particular implementation, in which such a switch couples a power source to a load, each crossing detection circuit includes capacitors coupled to nodes in series with the switch and operable to sample and hold values. The crossing detection circuits generate a signal crossing detection output based upon the sample value, and control the switch accordingly.

In some implementations, a controller circuit resets the crossing detection circuits during a time that is mutually exclusive of a time at which another one of the circuits is being reset, to ensure consistent monitoring. In certain implementations, the controller circuit operates the first and second crossing detection circuits to ensure that at least one of the circuits is operating to detect signal crossings at all times while the apparatus is powered.

Turning now to the figures, FIG. 1 shows a circuit 100, in accordance with another example embodiment. A power supply 110 feeds a circuit component including a cutoff switch 120, which provides power to a load. Respective crossing detection circuits 130 and 140 operate to monitor the signal provided to the cutoff switch 120 for zero crossings. Reset circuits 132 and 142 respectively operate to reset, or auto-zero, each of the crossing detection circuits 130 and 140.

In some implementations, the circuit 100 operates as follows. Crossing detection circuit 130 detects a signal crossing of an electrical signal when a first time cycle is active, in which the signal crossing pertains to a fixed value that the signal crosses (e.g., a zero value). Similarly, crossing detection circuit 140 detects the signal crossing of the electrical signal during a second time cycle that is different than the first time cycle. The reset circuits 132 and 142 (which are combined in some embodiments) reset the respective crossing detection circuits 130 and 140 to ensure that one of the two crossing detection circuits is operating at all times. For instance, resetting of the crossing detection circuit 130 can be restricted to the second time cycle to ensure that the crossing detection circuit 140 is active during the reset, and thus ensure that constant protection is provided. When a crossing is detected, the circuit 100 provides an output indicative thereof, such as for disabling or closing the cutoff switch 120.

Figure 2:
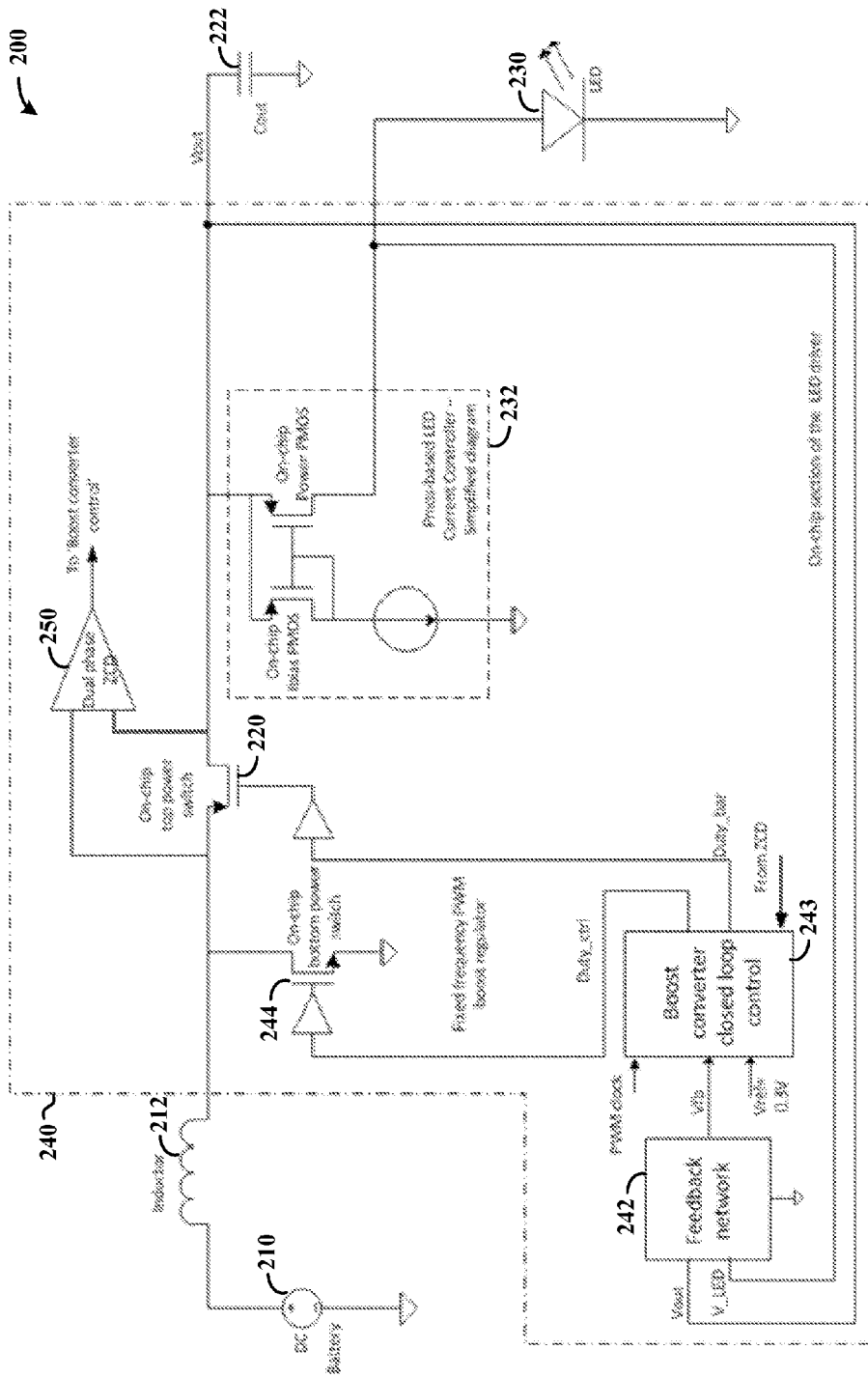
FIG. 2 shows an inductor-based pulse-width modulation (PWM) boost LED driver circuit, in accordance with another example embodiment.

FIG. 2 shows an inductor-based pulse-width modulation (PWM) boost LED driver circuit 200, in accordance with another example embodiment. A power supply 210 feeds power via an inductor 212, through a top switch 220 for driving a load, shown here by way of example as an LED 230 with a current controller 232, with the respective circuits forming part of an LED driver section 240. A front-end PWM switching boost regulator component includes a boost converter 243 connected to the LED 230 via feedback network 242, with power fed to the boost converter 243 via bottom switch 244. The feedback network 242 provides a comparison between voltage provided to the LED 230 and an output voltage coupled from the top switch 220 to an output capacitance 222. The boost converter 243 controls operation of the top switch 220, based on an output from a dual-phase ZCD circuit 250 and feedback, which may be implemented in accordance with one or more embodiments herein.

The dual-phase ZCD circuit 250 is used to detect the moment at which current through the top switch 220 is zero, and operates with the other components in the PWM boost LED driver circuit 200 to turn the top switch 220 off to save energy and protect the circuit. Such a zero-current scenario may, for example, occur when the regulator's average output current is at low level. The dual-phase ZCD circuit 250 includes two or more zero-crossing components that monitor for zero crossings and that are operated such that at least one component is on while the PWM boost LED driver circuit 200 is operating. Each of the zero-crossing components carries out a reset function during time periods in which the other of the zero-crossing components is actively monitoring for zero-crossings.

The PWM boost LED driver circuit 200 may be implemented in handheld devices, such as smart mobile phones that employ a 2.5V-5V input voltage and send an output current up to 1.5 Amps (e.g., at a higher output voltage) to a load such as an LED device. For instance, such input power may be provided by a Li-ion or other type of battery in a mobile device (e.g., having a voltage range of 2.5V-4.2V), with an inductor-based boost regulator used to drive the system. Further, the PWM boost LED driver circuit 200 may be integrated on a single chip.

Figure 3:
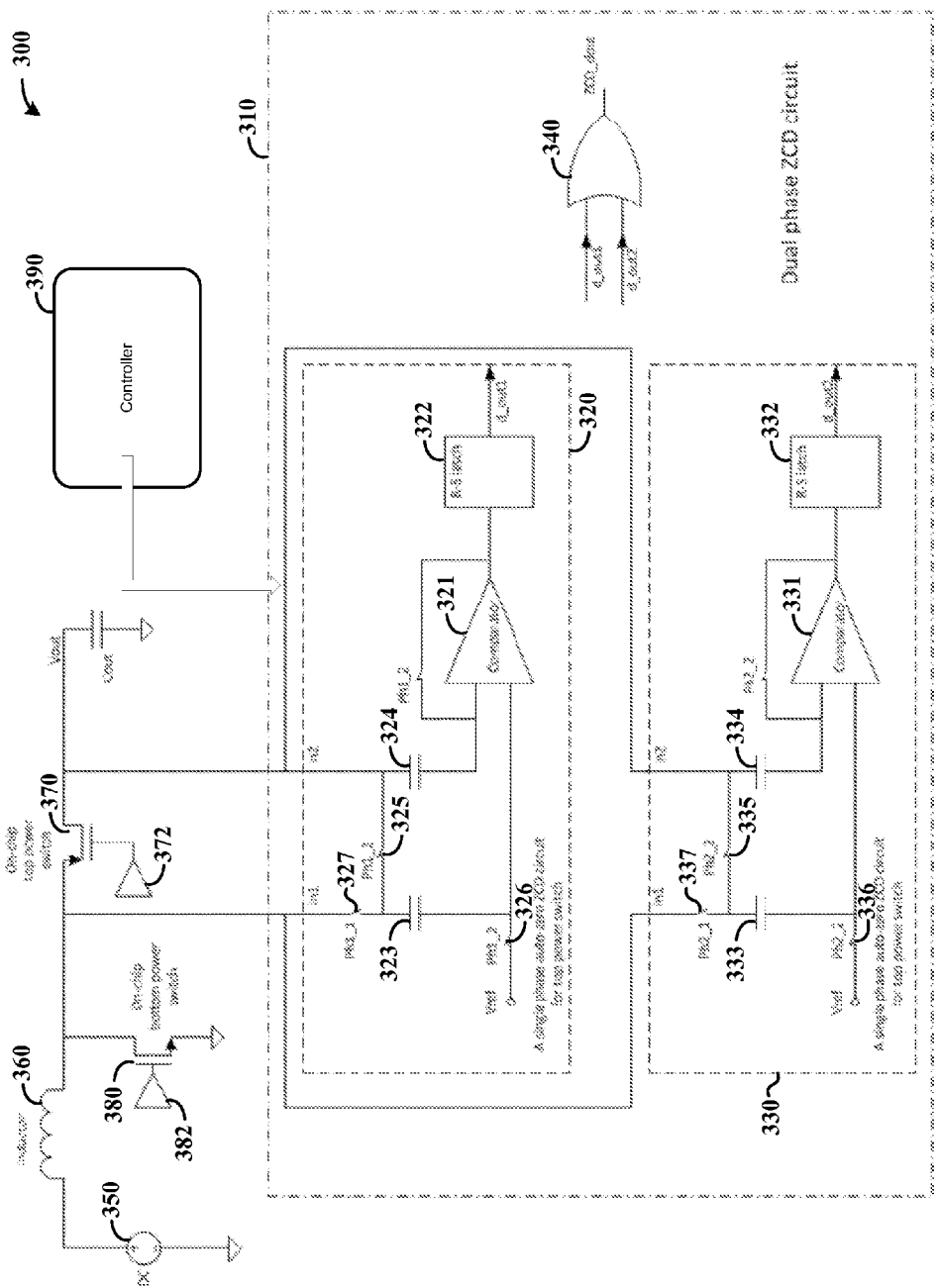
FIG. 3 shows a dual-phase ZCD circuit, in accordance with another example embodiment.

FIG. 3 shows a dual-phase ZCD circuit 300, in accordance with another example embodiment. The dual-phase ZCD circuit 300 includes a ZCD section 310 having respective single-phase ZCD circuits 320 and 330, each having a comparator 321/331, latch 322/332, capacitors 323/333 and 324/334, and switches 326/336, 327/337 and 325/335, coupled in a similar manner, respectively. An OR gate 340 provides an output ZCD dout based upon respective outputs of the comparators 321 and 331.

The ZCD section 310 monitors zero crossings for power supply 350, which provides an output that is passed via inductor 360 to top and bottom switches 370 and 380, respectively operated by diodes 372 and 382. More specifically, respective input ports in1 and in2 of the ZCD section are connected across the top switch 370, and the inputs are provided to each of the single-phase ZCD circuits 320 and 330. In some implementations, a controller circuit 390 operates to control switches 325, 326 and 327, as well as 335, 336 and 337, to control reset and monitoring modes of the ZCD section 310.

Referring to single-phase ZCD circuit 320, the capacitors 323 and 324 isolate the power signals from power supply 350, and can be used for input offset voltage sampling and holding. As such, the single-phase ZCD circuit 320 may be operated in a different voltage domain from that of the power supply 350. The values at the capacitors 323 and 324 are provided to the comparator 321, which operates to set the latch 322 with regard to the detection of a zero crossing condition (e.g., a zero current condition). The output of the latch 322, as provided to the OR gate 340, is in turn used to turn the top switch 370 off when such a zero crossing is detected. The single-phase ZCD circuit 330 operates in a similar manner, with regard to the similarly-labeled circuitry.

The single-phase ZCD circuits 320 and 330 operate with regard to each other to ensure that one of the ZCD circuits continues to monitor for zero crossings while a reset or auto-zero type operation is carried out in the other one of the ZCD circuits. For instance, when an auto-zero phase requires some amount of time that could be longer than a monitoring period, such an auto-zero process may not be fully settled, which can result in some offset residue left on one of the capacitors. Accordingly, the ZCD circuits operate to address these issues, by alternately performing ZCD and providing time for an auto-zero operation (e.g., a full PWM clock period plus duty time).

Figure 4:
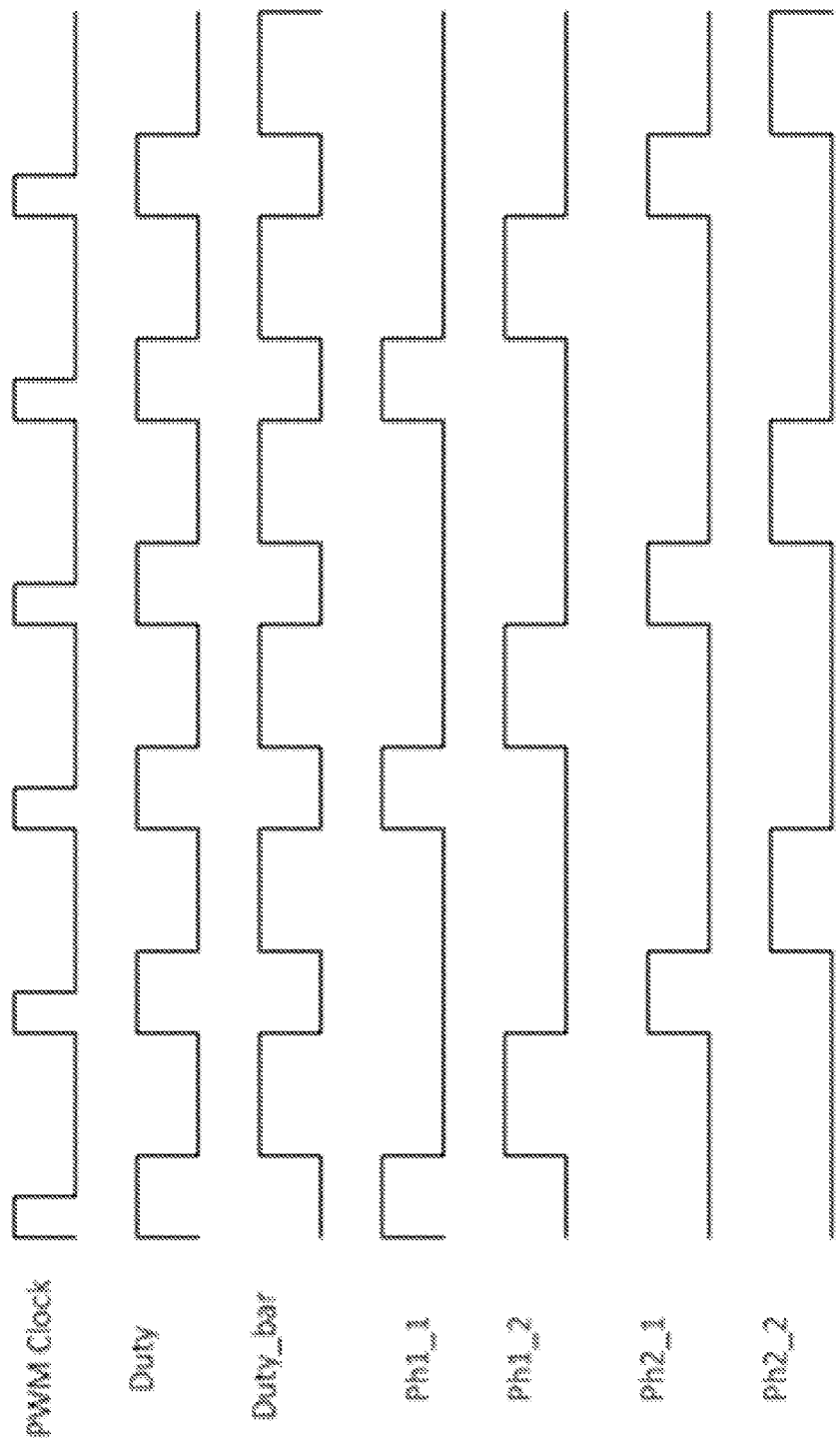
FIG. 4 shows a clock diagram for a dual-phase auto-zero ZCD circuit, as may be implemented in accordance with one or more embodiments.

FIG. 4 shows a clock diagram for a dual-phase auto-zero ZCD circuit, as may be implemented in accordance with one or more embodiments. By way of example, the respective signals shown in FIG. 4 may be implemented with FIG. 3. The PWM clock signal is provided to clock the respective single-phase ZCD circuits 320 and 330, which generate an output from the OR gate 340 that corresponds to the Duty or Duty_bar signals. These Duty or Duty_bar signals respectively operate or disable the top switch 370 based on the detection of a zero crossing. Operation of switches Ph1_1 (327), Ph1_2 (325/326), Ph2_1 (337) and Ph2_2 (335/336) is carried out as shown, for effecting auto-zero while also maintaining the monitoring of the top switch 370.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., providing the signals and switch control as in FIG. 4, or controlling the crossing detection or auto-zero functions at blocks 130/132 and 140/142 in FIG. 1). For example, in certain of the above-discussed embodiments, one or more modules are discrete logic circuits or programmable logic circuits, configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions. In addition, the various embodiments described herein may be combined in certain embodiments, and various aspects of individual embodiments may be implemented as separate embodiments." For instance, aspects of FIGS. 3 and 4 relating to detecting zero crossings and auto-zero functions can be carried out with the blocks in FIG. 1.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different types of logic circuits can be implemented to carry out similar functions. Such modifications do not depart from the true spirit and scope of various aspects of the invention, including aspects set forth in the claims.

What is claimed is:

1. An apparatus comprising:
   a first crossing detection circuit configured and arranged to detect a signal crossing of an electrical signal when a first time cycle is active, the signal crossing pertaining to a fixed value that the signal crosses;
   a second crossing detection circuit configured and arranged to detect the signal crossing of the electrical signal when a second time cycle is active, the first time cycle being different than the second time cycle;
   a reset circuit configured and arranged to reset the first crossing detection circuit while the second time cycle is active, and to reset the second crossing detection circuit while the first time cycle is active; and
   the first and second crossing detection circuits being configured and arranged to provide a signal crossing detection output in response to the signal crossing pertaining to the fixed value during any of the first and second time cycles.

2. The apparatus of claim 1, further including a boost regulator circuit configured and arranged with the first and second crossing detection circuits to terminate boost regulator operation in response to either one of the first and second crossing detection circuits detecting the signal crossing.

3. The apparatus of claim 1, wherein the first and second crossing detection circuits are respectively configured and arranged to detect the signal crossing by detecting a signal crossing indicative of zero current.

4. The apparatus of claim 1, wherein the reset circuit is configured and arranged to reset the first and second crossing detection circuits by resetting charge accumulated at respective capacitor circuits to a reference value.

5. The apparatus of claim 1, further including a light-emitting diode (LED) and a LED current controller configured and arranged to decouple current to the LED in response to the signal crossing detection output being indicative of the signal crossing.

6. The apparatus of claim 1, further including a switch configured and arranged to couple a power source to a load, wherein each of the first and second crossing detection circuits is configured and arranged to switch the switch to an off state in response to the signal crossing detection output being indicative of a signal crossing.

7. The apparatus of claim 1,
   further including a switch configured and arranged to couple a power source to a load,
   wherein each of the first and second crossing detection circuits includes first and second capacitors coupled to circuit nodes connected in series with the switch, the first and second capacitors being configured and arranged to sample and hold a value indicative of a zero crossing, and each of the first and second crossing detection circuits being configured and arranged to detect a zero crossing based on the sample and hold value.

8. The apparatus of claim 1, further including a controller circuit configured and arranged to reset the first and second crossing detection circuits by resetting each circuit during a time that is mutually exclusive of a time during which the other one of the circuits is being reset.

9. The apparatus of claim 8, wherein the controller circuit is configured and arranged to operate the first and second crossing detection circuits to ensure that at least one of the circuits is operating to detect signal crossings at all times while the apparatus is powered.

10. An apparatus comprising:
a first crossing detection circuit configured and arranged to detect a signal crossing of an electrical signal when a first time cycle is active, the signal crossing pertaining to a fixed value that the signal crosses;
a second crossing detection circuit configured and arranged to detect the signal crossing of the electrical signal when a second time cycle is active, the first time cycle being different than the second time cycle;
a reset circuit configured and arranged to reset the first crossing detection circuit while the second time cycle is active, and to reset the second crossing detection circuit while the first time cycle is active; and
the first and second crossing detection circuits being configured and arranged to provide a signal crossing detection output in response to the signal crossing pertaining to the fixed value during any of the first and second time cycles; and
a switch configured and arranged to couple a power source to a load, wherein each of the first and second crossing detection circuits is configured and arranged to
detect a signal crossing based upon a voltage value across the switch, and
operate the switch in a position in response to the signal crossing detection output being indicative of a signal crossing, therein mitigating coupling of a zero-current condition to the load.

11. The apparatus of claim 1,
further including a switch configured and arranged to couple a power source to a load,
wherein each of the first and second crossing detection circuits includes first and second capacitors coupled to circuit nodes connected in series with the switch,
wherein the switch is configured and arranged to couple the circuit nodes and the capacitors are configured and arranged to provide a sample value indicative of a voltage across the switch, and
the first and second crossing detection circuits are configured and arranged to generate the signal crossing detection output based upon the sample value.

12. An apparatus comprising:
a first means for detecting a signal crossing of an electrical signal when a first time cycle is active, the signal crossing pertaining to a fixed value that the signal crosses;
a second means for detecting a signal crossing of the electrical signal when a second time cycle is active, the first time cycle being different than the second time cycle, wherein the first means and the second means includes circuitry; and
the first and second means for detecting the signal crossing being configured and arranged to
provide a signal crossing detection output in response to the signal crossing the fixed value during any of the first and second time cycles, and
independently operate in a reset condition, with the first means operating in the reset condition during a time period that is exclusive of a time period during which the second means operates in the reset condition, wherein the first and second means are respectively configured and arranged to operate in response to the reset condition by receiving an input signal that causes circuitry in the first and second means to reset.

13. The apparatus of claim 12, further including switching means configured and arranged to terminate operation of a circuit in response to either one of the first and second means detecting the signal crossing.

14. The apparatus of claim 12, wherein the first and second means are respectively configured and arranged to operate in the reset condition by resetting accumulated capacitive charge to a reference value.

15. The apparatus of claim 12, further including switching means and a load connected to the switching means, the first and second means for detecting the signal crossing being configured and arranged to operate the switching means to decouple the load in response to the signal crossing detection output being indicative of the signal crossing.

16. The apparatus of claim 12,
further including a switch configured and arranged to couple a power source to a load,
wherein each means for detecting the signal crossing includes first and second capacitors coupled to circuit nodes connected in series with the switch, and a comparator connected to the capacitors and configured and arranged to provide an output based on a comparison between a value provided by each of the capacitors, and
wherein the first and second means for detecting the signal crossing are configured and arranged to generate the signal crossing detection output based upon the output of the comparator.

17. A method comprising:
detecting, via a first circuit, a signal crossing of an electrical signal when a first time cycle is active, the signal crossing pertaining to a fixed value that the signal crosses;
detecting, via a second circuit, the signal crossing of the electrical signal when a second time cycle is active, the first time cycle being different than the second time cycle;
proving a signal crossing detection output in response to the signal crossing the fixed value during any of the first and second time cycles; and
independently operating the first and second circuits in a reset condition, with the first circuit operating in the reset condition during a time period that is exclusive of a time period during which the second circuit operates in the reset condition, including independently discharging an accumulated capacitive charge in the first and second circuits to a reference value.

18. The method of claim 17, further including terminating operation of a circuit in response to detecting the signal crossing via either one of the first and second circuits.

19. The method of claim 17, further including using the signal crossing detection output to disconnect a load in response to detecting a signal crossing during either one of the time cycles, the respective time cycles covering all time during which the load is operating.

* * * * *